(12) United States Patent
Chen

(10) Patent No.: US 7,005,331 B2
(45) Date of Patent: Feb. 28, 2006

(54) METHOD OF MANUFACTURING A THIN FILM TRANSISTOR ARRAY

(75) Inventor: Hung-De Chen, Tao Yuan Shien (TW)

(73) Assignee: Quanta Display Inc., Tao Yuan Shien (TW)

( * ) Notice: Subject to any disclaimer, the term of this patent is extended or adjusted under 35 U.S.C. 154(b) by 0 days.

(21) Appl. No.: 10/878,320

(22) Filed: Jun. 29, 2004

(65) Prior Publication Data

US 2005/0124088 A1    Jun. 9, 2005

(30) Foreign Application Priority Data

Dec. 3, 2003    (TW) .............................. 92134265 A

(51) Int. Cl.
*H01L 21/00*    (2006.01)
(52) U.S. Cl. ..................... 438/158; 438/151; 438/30
(58) Field of Classification Search ................. 438/30, 438/151, 158
See application file for complete search history.

(56) References Cited

U.S. PATENT DOCUMENTS

| | | | | |
|---|---|---|---|---|
| 4,738,749 A | * | 4/1988 | Maurice et al. ............... | 438/30 |
| 6,255,130 B1 | * | 7/2001 | Kim ............................. | 438/30 |
| 6,444,505 B1 | * | 9/2002 | Chen et al. .................. | 438/149 |
| 6,537,840 B1 | * | 3/2003 | Tseng ........................... | 438/30 |
| 6,744,486 B1 | * | 6/2004 | Kim et al. .................. | 349/187 |
| 6,833,896 B1 | * | 12/2004 | Lee ............................. | 349/141 |
| 6,869,833 B1 | * | 3/2005 | Chen .......................... | 438/158 |
| 2003/0193056 A1 | * | 10/2003 | Takayama et al. ............ | 257/79 |
| 2003/0232454 A1 | * | 12/2003 | Bischoff et al. .............. | 438/16 |

* cited by examiner

*Primary Examiner*—Matthew Smith
*Assistant Examiner*—Lex H. Malsawma
(74) *Attorney, Agent, or Firm*—Bacon & Thomas, PLLC

(57) ABSTRACT

A method for manufacturing a thin film transistor array substrate is disclosed. A first metal layer, a gate insulating layer, a semiconductor layer, an ohmic contact layer and a second metal layer are sequentially formed over a substrate, and a first patterning process is carried out to define a source/drain electrodes area, a scan line area, a data line area, a terminal contact area and a pixel area. An interlayer insulating layer is formed, and a second patterning process is implemented to form a source/drain contact hole, a scan line contact hole and a terminal contact hole. A transparent conductive layer, a third metal layer and a passivation layer are sequentially formed over the substrate to achieve electrical contacts among above-mentioned contact holes, and a third patterning process is then implemented to form a thin film transistor, a scan line, a data line, a terminal contact and a pixel electrode.

20 Claims, 16 Drawing Sheets

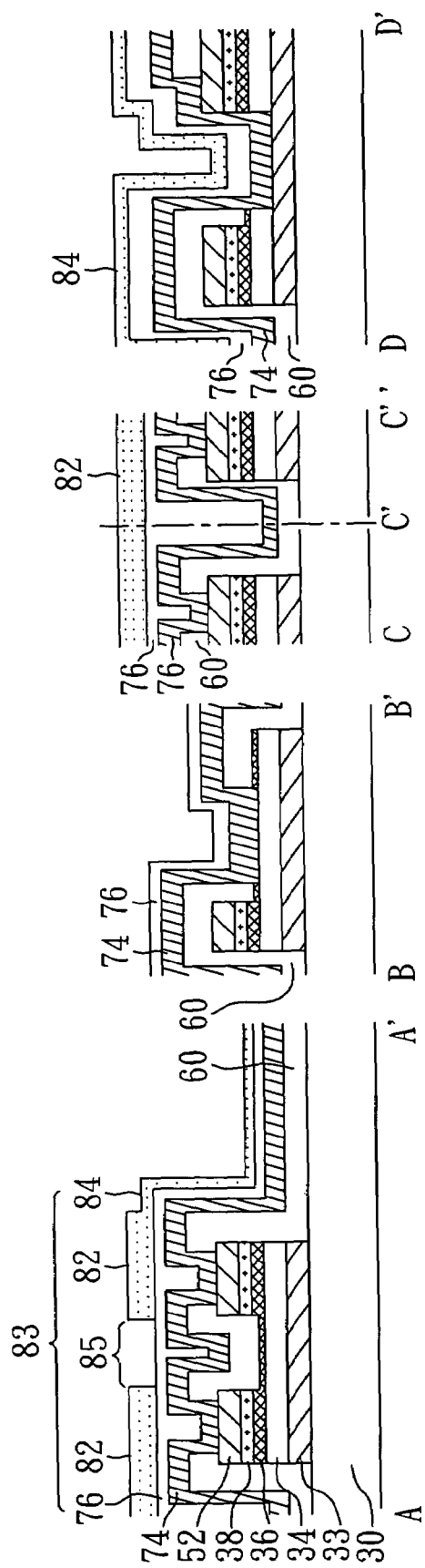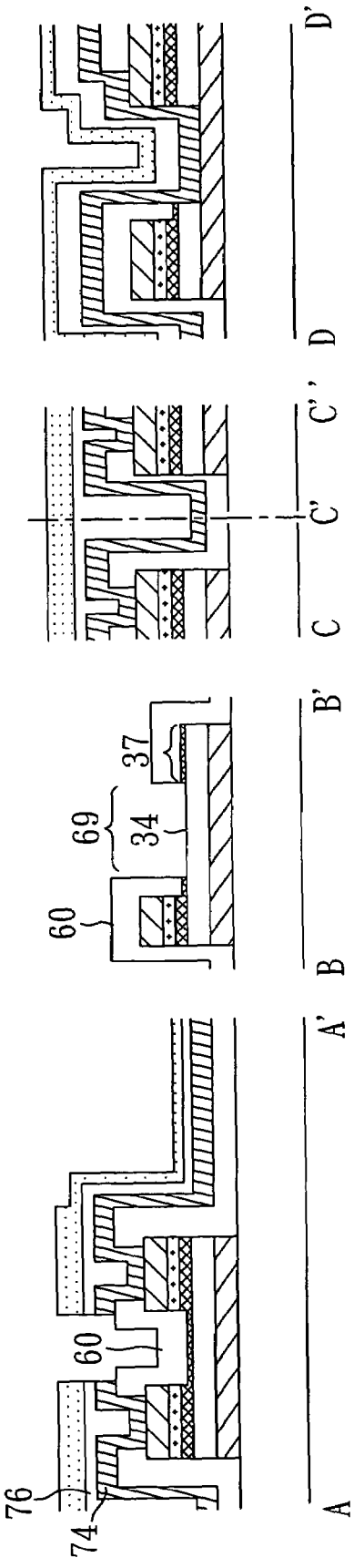
FIG. 11A
FIG. 11B

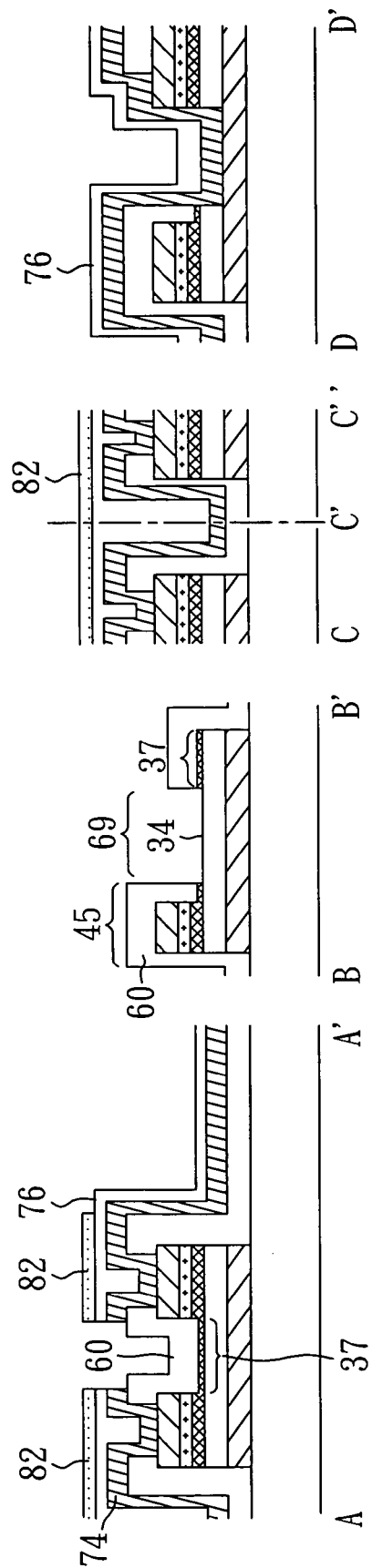
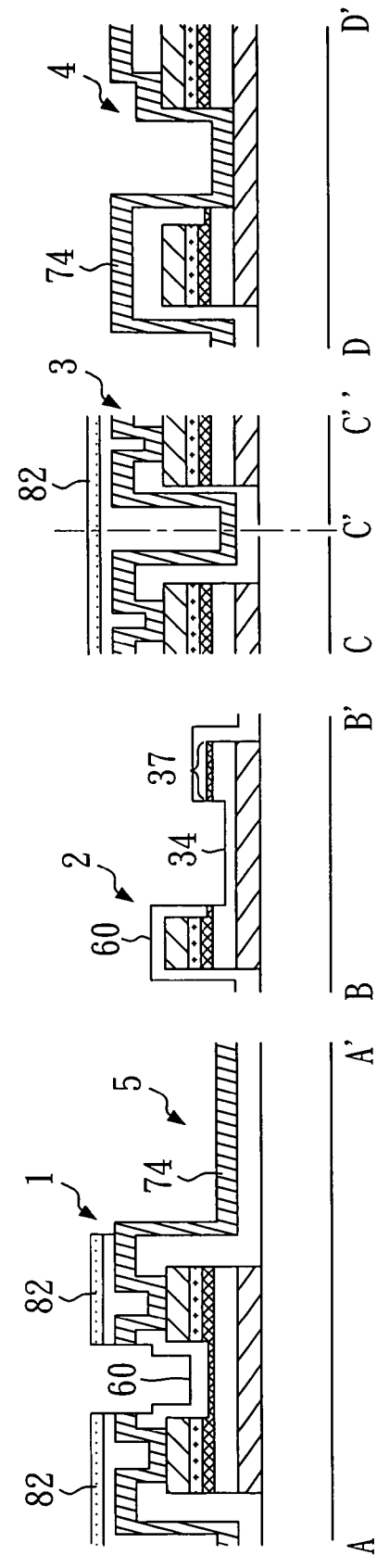
FIG. 11C
FIG. 11D

METHOD OF MANUFACTURING A THIN FILM TRANSISTOR ARRAY

BACKGROUND OF THE INVENTION

1. Field of the Invention

The present invention relates to a method for manufacturing a thin film transistor (TFT) array substrate and, more particularly, to a method for manufacturing a TFT array substrate that has reduced photolithography steps.

2. Description of Related Art

The thin film transistor liquid crystal display (TFT-LCD) is mainly composed of a TFT array substrate, a color filter (CF) array substrate, and a liquid crystal layer interposed therebetween. On the TFT array substrate, a plurality of TFTs arranged in an array and a plurality of pixel electrodes, each corresponding to one of the TFTs, form a plurality of pixel structures. Moreover, each of the TFTs is composed of a gate, a channel, a drain electrode and a source electrode, and acts as a switch element of a liquid crystal displaying pixel unit.

In general, a TFT array substrate is manufactured by using five photolithography steps. The first photolithography step defines the first metal layer and thereby forms the scan line and the gate of the thin film transistor. The second photolithography step defines the channel and the ohmic contact layer of the thin film transistor. The third photolithography step is used to define the second metal layer and thereby to form the data line and the source/drain electrodes of the thin film transistor. The fourth photolithography step patterns the passivation layer. As for the fifth photolithography step, it patterns the transparent conductive layer and thereby forms the pixel electrode.

However, as the development of the TFT-LCD device is directed towards a bigger and bigger active area, the manufacturing method of the TFT array substrate currently used will encounter lots of problems in the future. For example, it may suffer a low yield and a low production rate. Therefore, if the photolithography steps used in the manufacturing of TFTs can be lowered, i.e. the frequency of exposure process when manufacturing the TFTs is reduced, the production time can be reduced, the production rate can be increased, and thereby the manufacturing cost can be lowered.

U.S. Pat. No. 6,255,130 disclosed a method for manufacturing a TFT array substrate using four photolithography steps. With reference to FIGS. 1 to 4, there are shown schematic views of the manufacturing process of a TFT. First, a glass substrate 10 is provided, and a gate electrode 12 made of copper or aluminum is formed on the glass substrate 10, as shown in FIG. 1. Next, a gate insulating layer 14, an amorphous silicon layer 16 and a metal layer 18 are formed sequentially on the gate electrode 12. Thereafter, a halftone photolithography process or a photoresist reflow process is carried out to form a photoresist layer 20 having a slit 22 on the glass substrate 10. The halftone photolithography process uses a mask having a substantially transparent area, a partially transparent area and a substantially opaque area. The substantially opaque area is corresponding to an area, on which a thicker photoresist will be formed, and the partially transparent area is corresponding to another area, on which the slit 22 or a thinner photoresist will be formed.

With reference to FIG. 2, a first etching process is subsequently carried out to remove the metal layer 18 and the amorphous silicon layer 16 which are not covered by the photoresist layer 20. Then, the photoresist layer 20 in the slit 22 is wholly removed, and the remaining photoresist layer 20 is thinned simultaneously. Afterward, with reference to FIG. 3, a second etching process is carried out to remove the metal layer 18 that is not covered by the remaining photoresist layer 20, then a source 24 and a drain 26 of a TFT are therefore formed.

Finally, a passivation layer 28 made of silicon oxide or silicon nitride is formed over the glass substrate 10 after the photoresist layer 20 is removed, as shown in FIG. 4. Accordingly, the TFT is completed.

The prior art forms a ladder shape photoresist layer having more than two thicknesses by applying the halftone photolithography process or the photoresist reflow process. If the halftone photolithography process or the photoresist reflow process can be applied to form other structures of the thin film transistor, the photolithography steps will be further reduced. Also, the yield and production rate can thus be increased.

Therefore, the present invention provides a method for manufacturing a TFT array substrate using three photolithography steps only to mitigate the aforementioned problems.

SUMMARY OF THE INVENTION

The object of the present invention is to provide a method for manufacturing a TFT array substrate, which utilizes the halftone photolithography technique or the photoresist reflow technique to carry out the patterning of the TFT array substrate in three photolithography steps, and can thus achieve the efficiencies of high yield and high production rate.

Another object of the present invention is to provide a method for manufacturing a TFT array substrate used in a transmissive type, a reflective type or a transflective type liquid crystal display device. The method utilizes the halftone photolithography technique or the photoresist reflow technique to carry out the patterning of the TFT array substrate in three photolithography steps, and can thus achieve the efficiencies of high yield and high production rate.

The objects, novel features, and advantages of the present invention will become more apparent for those skilled in the art by means of the following detailed description that is taken in conjunction with the accompanying drawings.

BRIEF DESCRIPTION OF THE DRAWINGS

FIGS. 11A to 11D are schematic views showing the process flow of the third patterning process in the second embodiment of the present invention.

DETAILED DESCRIPTION OF THE PREFERRED EMBODIMENT

To achieve the above-mentioned objects, features and advantages, the present invention provides a method for manufacturing a thin film transistor (TFT) array substrate using three photolithography steps only. The method mainly includes the following steps. First, a first metal layer, a gate insulating layer, a semiconductor layer, an ohmic contact layer and a second metal layer are formed sequentially over the substrate. Then, a first patterning process is carried out to define a source/drain electrodes area, a scan line/gate line area, a data line area, a terminal contact area and a pixel area. Afterward, an interlayer insulating layer is formed over the substrate, and then a second patterning process is carried out to define a source/drain contact hole, a data line or scan line contact hole and a terminal contact hole. Thereafter, a transparent conductive layer (being formed optionally depending on the LCD device), a third metal layer and a passivation layer are formed sequentially over the substrate. Thus, the source/drain contact hole, the scan line contact hole and the terminal contact hole are electrically contacted to each other and can be well protected. Subsequently, a third patterning process is carried out to form a TFT, a scan line/gate line, a data line, a terminal contact and a pixel electrode. The first, the second and the third patterning processes mentioned above use the halftone photolithography process or the photoresist reflow process to form a photoresist layer having two areas, which have different thicknesses in a photolithography step.

The present invention will be explained in detail via the accompanying drawings. People skilled in the art should understand that those drawings intend to illustrate the present invention but not to limit the scope thereof.

Embodiment 1

Figure 1:
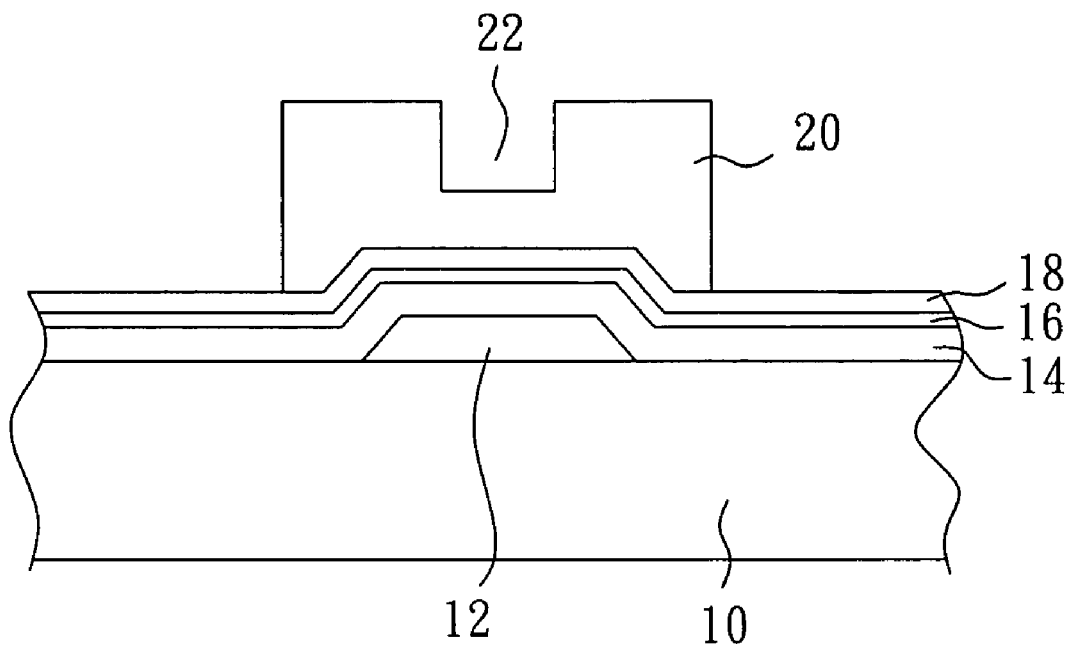
FIGS. 1 to 4 are schematic views showing the process flow of the manufacturing of the TFT in the prior art.
Figure 2:
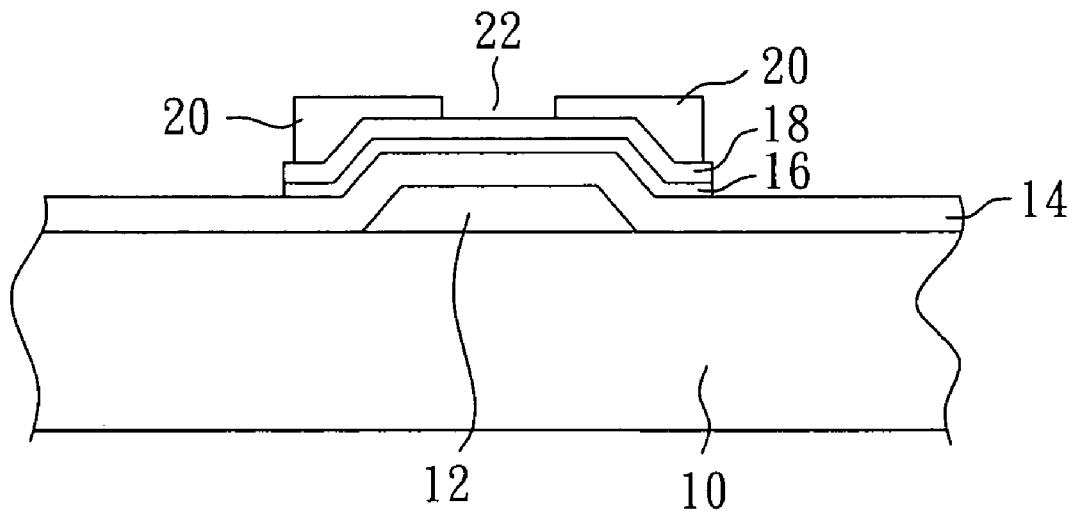
Figure 3:
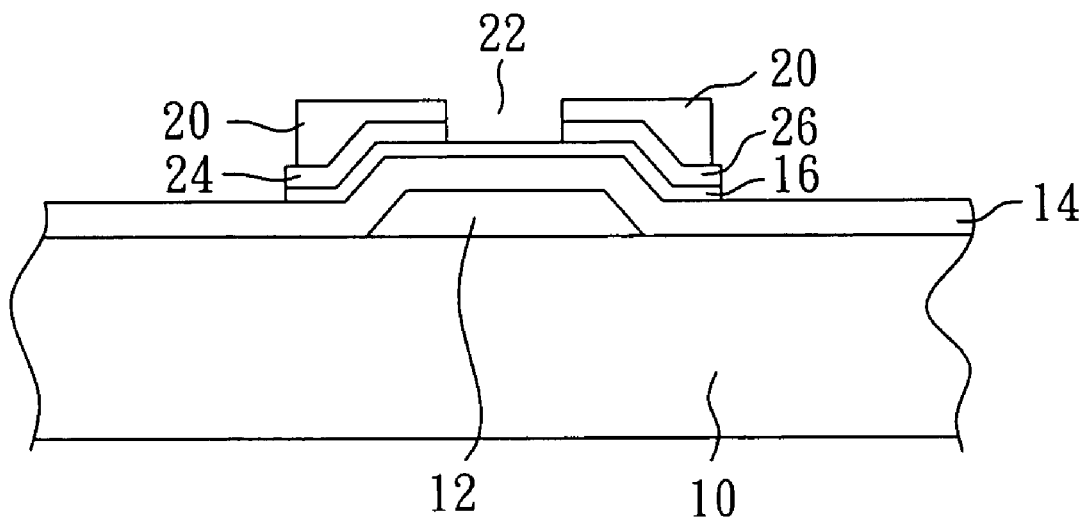
Figure 4:
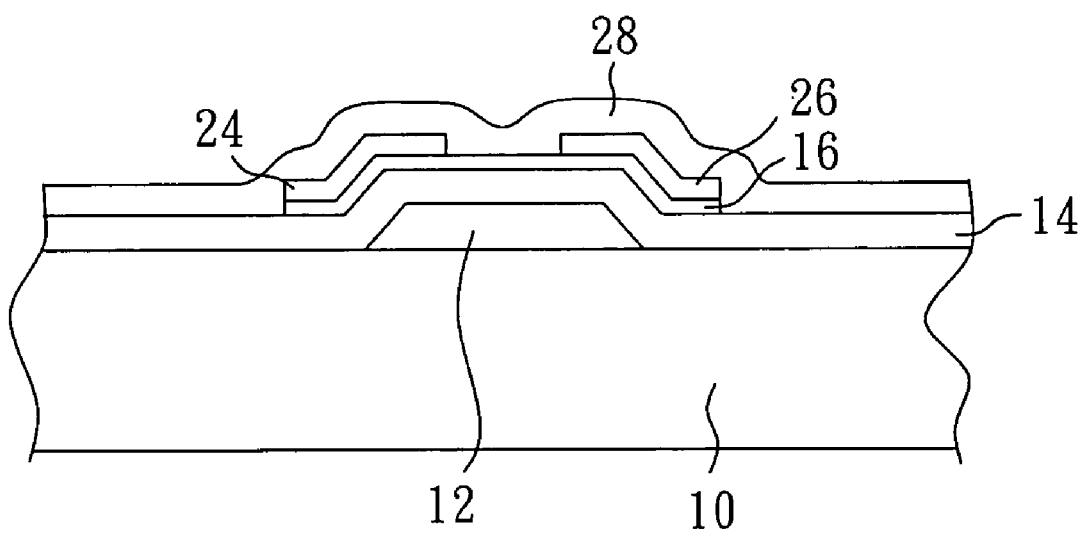
Figure 5:
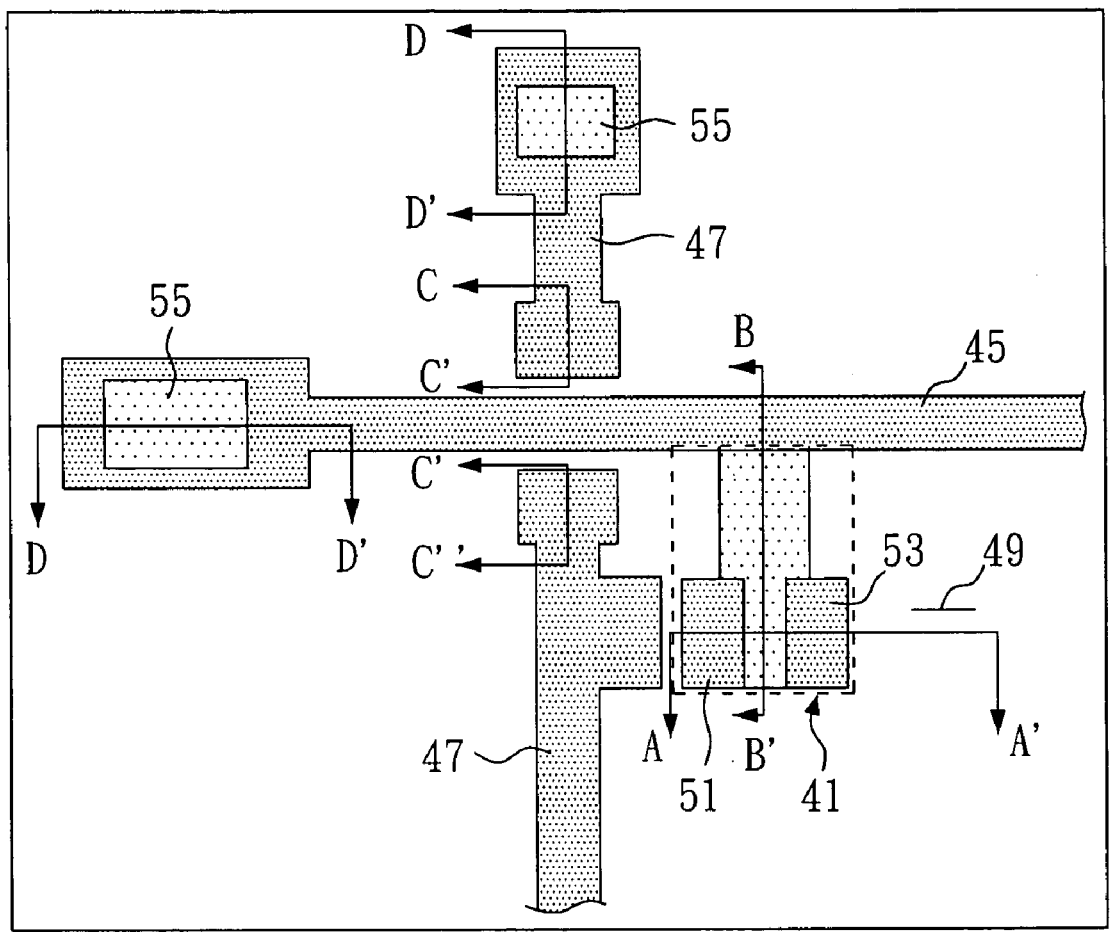
FIG. 5 is a top view showing the layout on the substrate of the first patterning process in the first embodiment of the present invention.

With reference to FIGS. 5 to 10, there are shown the schematic views of the process flow of the present embodiment. FIGS. 5 and 6A to 6D show the process flow of the first patterning process of the method for manufacturing a TFT array substrate. In particular, FIG. 5 is a top view showing the layout on the TFT array substrate of the first patterning process in the present embodiment, and FIGS. 6A to 6D are sectional views showing the process flow of the first patterning process in the present embodiment.

Figure 6A:
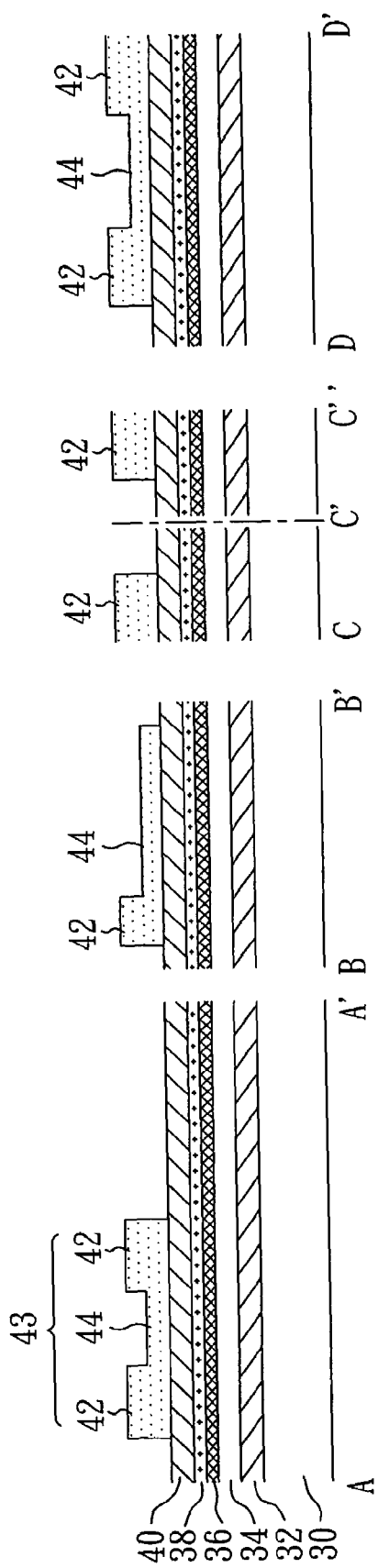
FIGS. 6A to 6D are schematic views showing the process flow of the first patterning process in the first embodiment of the present invention.

With reference to FIG. 6A, a substrate 30 is provided, first. The substrate 30 can be a glass substrate, a quartz substrate, or a plastic substrate. Next, a first metal layer 32 is deposited on the substrate 30. The first metal layer 32 is used to form the gate electrode of the thin film transistor, and can be made of aluminum (Al), tungsten (W), chromium (Cr), copper (Cu), titanium (Ti), titanium nitride (TiN$_x$), aluminum alloy, chromium alloy, or molybdenum (Mo). Also, the first metal layer 32 can have a single-layered or a multiple-layered structure. Afterward, a gate insulating layer 34, a semiconductor layer 36, and an ohmic contact layer 38 are sequentially formed on the first metal layer 32. The gate insulating layer 34 can be made of silicon oxide (SiO$_x$), silicon nitride (SiN$_y$), or Silicon oxynitride. The semiconductor layer 36 can be made of the amorphous silicon ($\alpha$-Si). The ohmic contact layer 38 can be made of, for example, the n-type doped silicon (n$^+$-Si). Moreover, the above-mentioned layers can be formed by using a chemical vapor deposition (CVD) process. Thereafter, a second metal layer 40 is formed on the ohmic contact layer 38. The material of the second metal layer 40 is the same as that of the first metal layer 32, and can be aluminum, tungsten, chromium, copper, titanium, titanium nitride, aluminum alloy, chromium alloy, or molybdenum. Similarly, the structure of the second metal layer 40 can be a single-layered or a multiple-layered structure.

Next, a first patterning process is carried out. With reference to FIGS. 5 and 6A, a photoresist layer 43 is formed on the second metal layer 40, and then a halftone photolithography process or a non-halftone photolithography process with a following photoresist reflow process is carried out to form the first photoresist layer, which has a first area 42 and a second area 44. The thickness of the second area 44 is thinner than that of the first area 42. Furthermore, the halftone photolithography process uses a mask that has a substantially transparent area, a partially transparent area, and a substantially opaque area. The substantially opaque area is corresponding to the first area 42, and the partially transparent area is corresponding to the second area 44. Hence, the single photolithography process can form the ladder shape photoresist layer that has two areas, which have different thickness from each other.

Figure 6B:
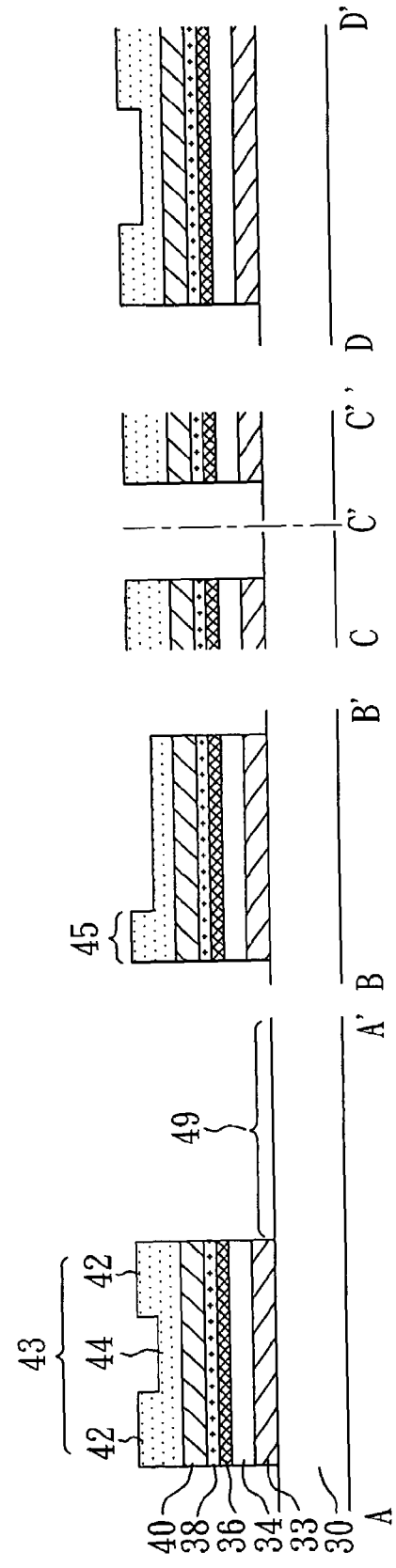

Afterward, the second metal layer 40 that is not covered by the first photoresist layer 43, and the ohmic layer 38, the semiconductor layer 36, the gate insulating layer 34, and the first metal layer 32 under the uncovered second metal layer 40 are etched sequentially, as shown in FIG. 6B. Consequently, a predetermined TFT area 41, a scan line area 45, a data line area 47, and a pixel area 49 as shown in FIG. 5 are defined.

Figure 6C:
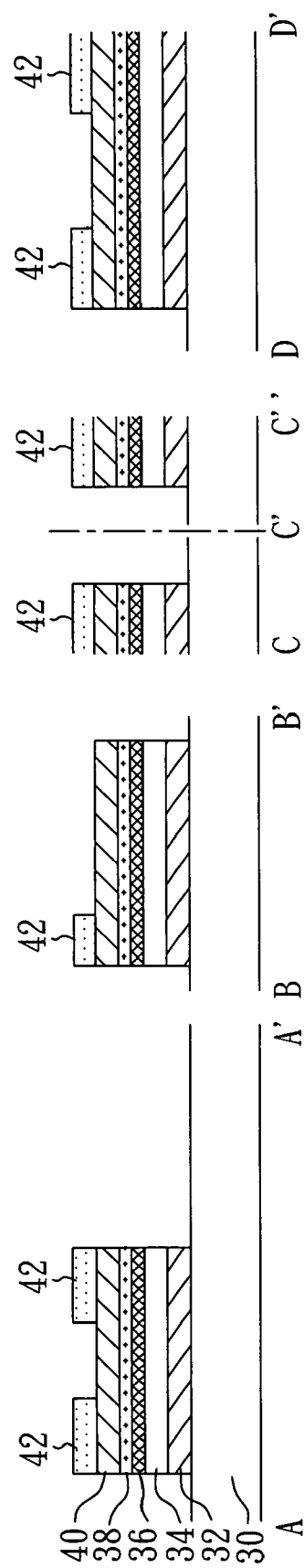
Figure 6D:
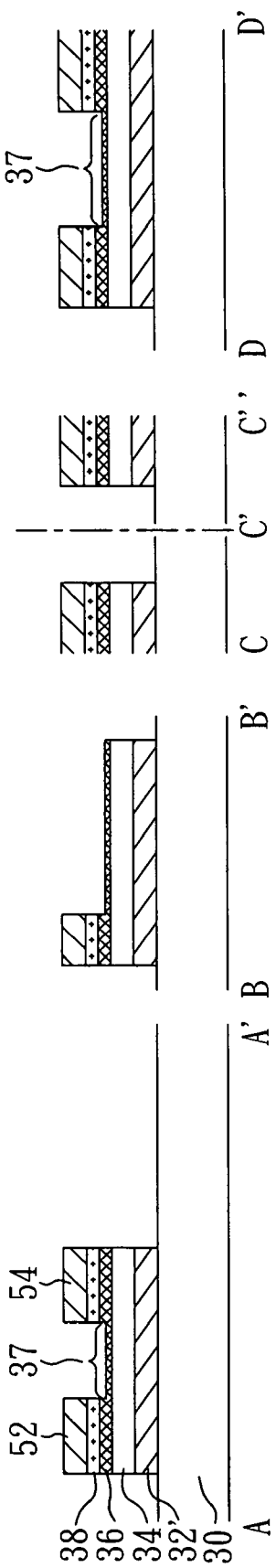

Subsequently, the photoresist in the second area 44 is removed by ashing, and thus the second metal layer 40 covered by the second area 44 is exposed, as shown in FIG. 6C. Simultaneously, the photoresist in the first area 42 becomes thinner, but remains resistant to the etching process. Further, with reference to FIG. 6D, the exposed second metal layer 40 and the ohmic contact layer 38 thereunder are etched to define a source electrode area 51, a drain electrode area 53, and a terminal contact area 55 in FIG. 5.

So far the first patterning process has been finished. As shown in FIG. 5, the data line area 47 is predetermined to form the data line of the TFT array. At the intersection of the data line area 47 and the scan line area 45, the data line area 47 does not connect with the scan line area 45. In addition, the data line area 47 does not connect with the source electrode area 51, either. With reference to FIG. 6D again, all of the gate electrode 32', the ohmic contact layer 38, the gate insulating layer 34, the channel 37, the source electrode 52, and the drain electrode 54 which compose the TFT have been formed already.

Figure 7:
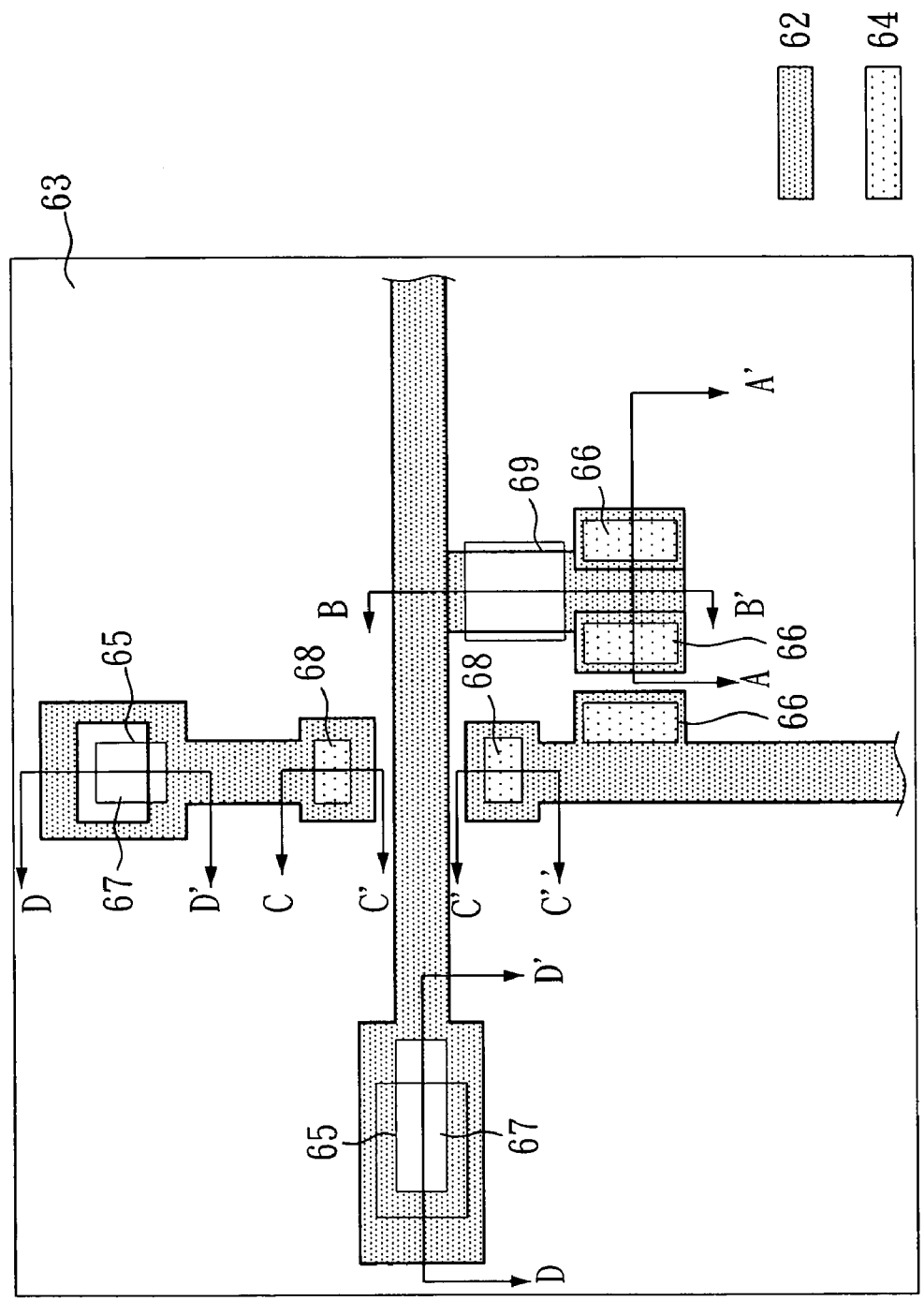
FIG. 7 is a top view showing the layout on the substrate of the second patterning process in the first embodiment of the present invention.

With reference to FIGS. 7 and 8A to 8D, there are schematic views showing the process flow of the second patterning process of the present invention. In particular, FIG. 7 shows the layout on the substrate when the second patterning process is carried out, and FIGS. 8A to 8D show the sectional views thereof.

Figure 8A:
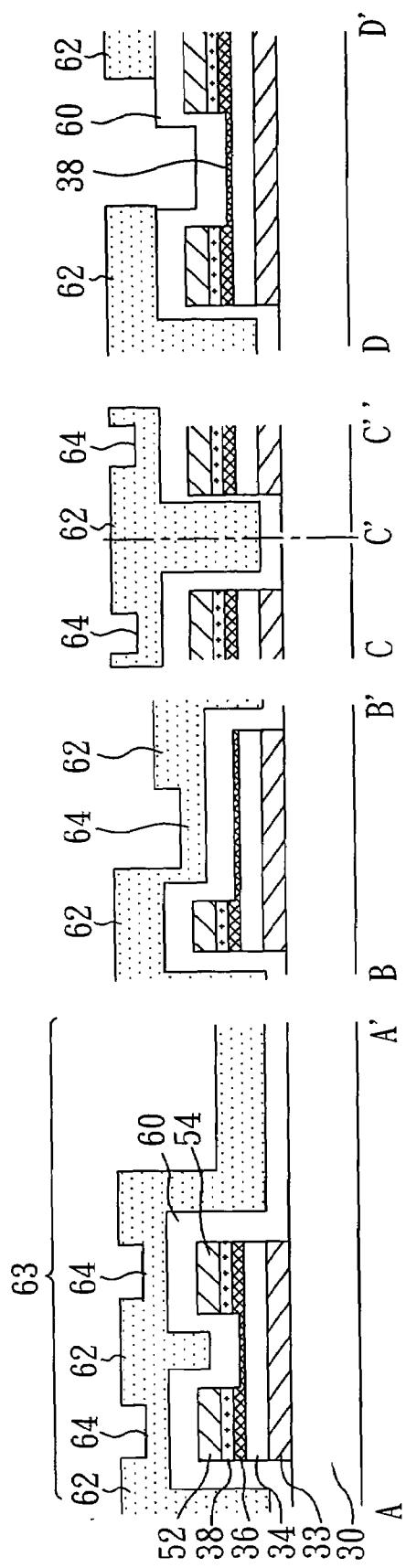
FIGS. 8A to 8D are schematic views showing the process flow of the second patterning process in the first embodiment of the present invention.

With reference to FIG. 8A, an interlayer insulating layer 60 is formed over the substrate 30. The same as the gate insulating layer 34, the interlayer insulating layer 60 can be made of silicon oxide, silicon nitride, or silicon oxynitride, and similarly can be formed by chemical vapor deposition.

Afterward, the second patterning process is carried out. As shown in FIGS. 7 and 8A, a photoresist layer 63 is formed on part of the interlayer insulating layer 60, and then like the first patterning process, a halftone photolithography process or a non-halftone photolithography process with a photoresist reflow process is implemented to form the second photoresist layer 63. Similarly, the second photoresist layer 63 has a third area 62 and a fourth area 64, of which the thickness is thinner than that of the third area 62.

Figure 8B:
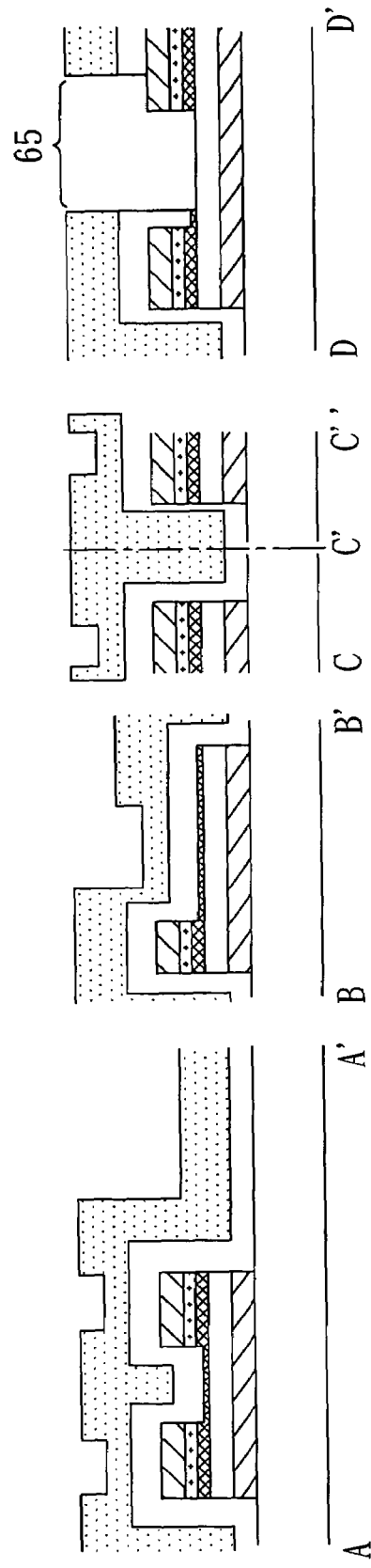

Next, the interlayer insulating layer 60 that is not covered by the second photoresist layer 63 and the semiconductor layer 38 under the abovementioned interlayer insulating layer 60 are etched sequentially to define a predetermined terminal contact hole area 65, as shown in FIG. 8B.

Figure 8C:
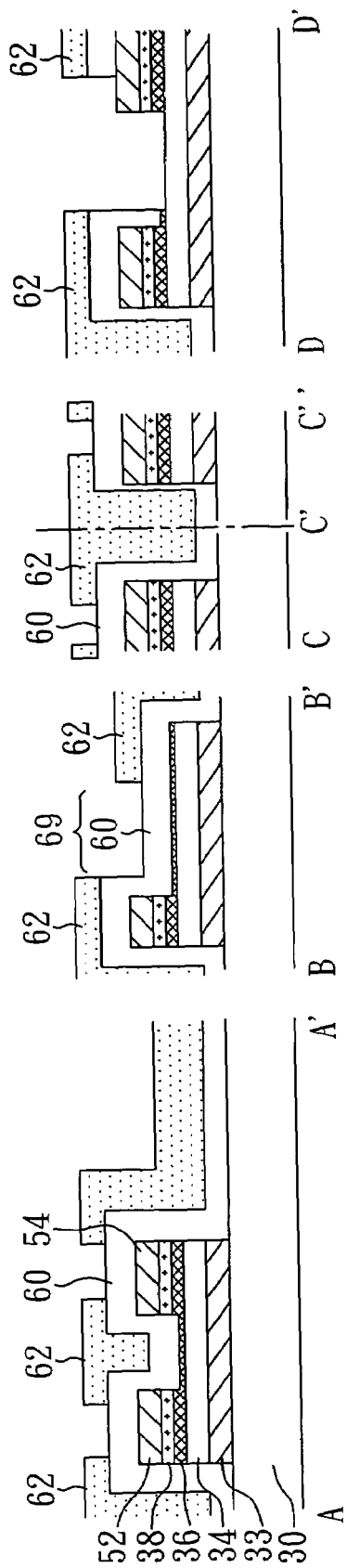
Figure 8D:
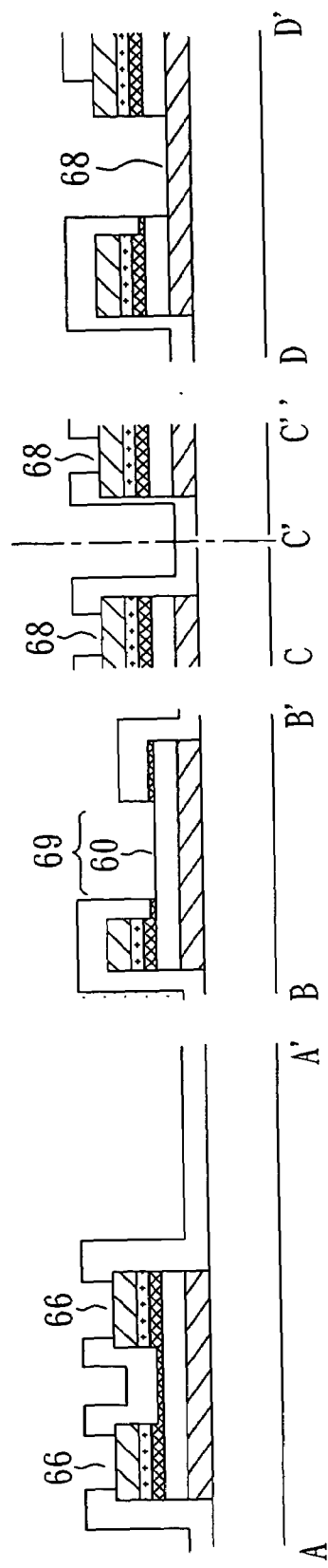

With reference to FIG. 8C, the fourth area 64 of the second photoresist layer 63 is then removed by ashing in order to expose the interlayer insulating layer 60. Thereafter, the exposed interlayer insulating layer 60 is etched to exposed the second metal layer 52, 54 thereunder and thereby forms the source/drain contact hole 66 and the data line contact hole 68, as shown in FIG. 8D. Simultaneously, the gate insulating layer 34 at the predetermined terminal contact hole area 65 is etched to expose the first metal layer 32 and thereby forms the terminal contact hole 67. In addition, part of the interlayer insulating layer 60 at the scan line area 45 and at the predetermined disconnection area 69 between the TFTs is removed, as shown in FIG. 8C. With reference to FIG. 8D, taking the metal layers as the etching stopper, the semiconductor layer 38 below the interlayer insulating layer at the predetermined disconnection area 69 can be further removed. As a result, the semiconductor layer 38 that constitutes the TFT is separated from the semiconductor layer 38 at the scan line area 45, so electric leakage issue will not happen between the scan line and the channel 37 of the TFT. Moreover, the predetermined disconnection area 69 above the first metal layer 32 that serves as the gate electrode 33 still can be protected by the gate insulating layer 34.

So far, the second patterning process has been completed.

On the other hand, part of the process flow of the second patterning process can also be replaced by other etching sequence. However, the accompanying drawings are omitted here.

Similarly, the interlayer insulating layer 60 that is not covered by the second photoresist layer 63 is etched except that the semiconductor layer 38 that is below the predetermined terminal contact hole area 65 is not etched immediately in order to shorten the etching time.

Thereafter, the fourth area of the second photoresist layer is removed by ashing, and then the interlayer insulating layer 60 that was covered by the fourth area is etched to expose the second metal layer 40 and thereby to form the contact holes 66, 68. Simultaneously, the interlayer insulating layer 60 at the predetermined disconnection area 69 and the semiconductor layer 38 thereunder will be removed by etching sequentially. Moreover, the semiconductor layer 38 at the predetermined terminal contact hole area 65 and the gate insulating layer thereunder are etched to expose the second metal 40 and the first metal 32 and to form the terminal contact hole 67.

As a result, the second patterning process can also be completed.

Figure 9:
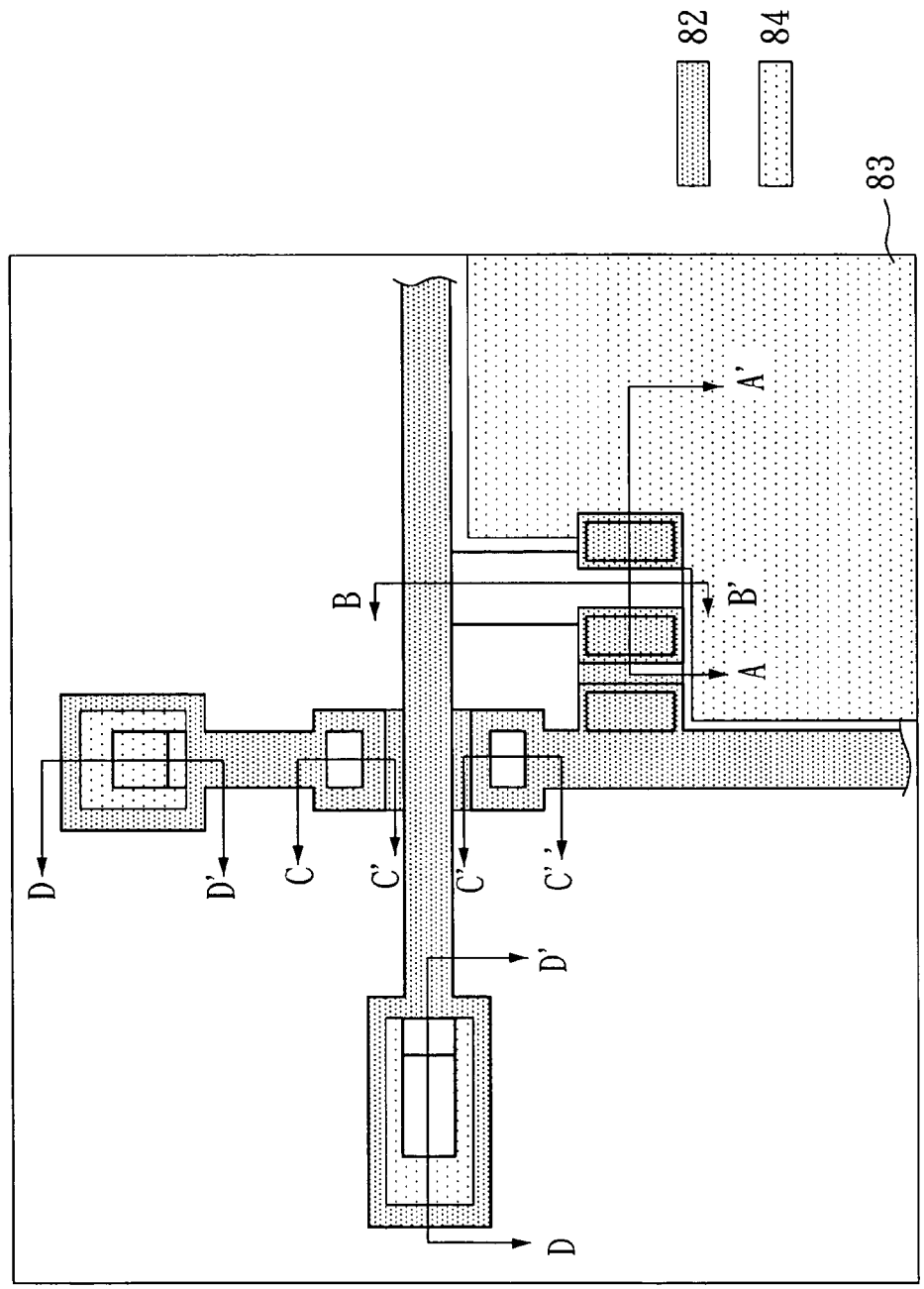
FIG. 9 is a top view showing the layout on the substrate of the third patterning process in the first embodiment of the present invention.

With reference to FIGS. 9 and 10A to 10G, there are schematic views showing the process flow of the third patterning process of the present invention. In particular, FIG. 9 shows the layout on the substrate when the third patterning process is carried out, and FIGS. 10A to 10D show the sectional views thereof.

Figure 10A:
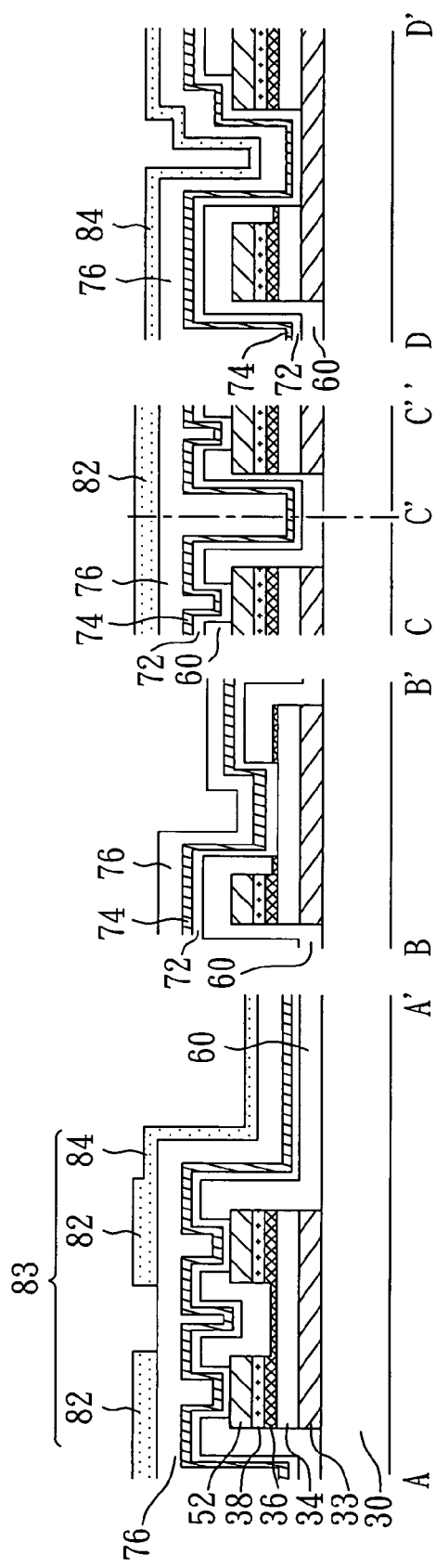
FIGS. 10A to 10G are schematic views showing the process flow of the third patterning process in the first embodiment of the present invention.

With reference to FIG. 10A, a transparent conductive layer 72, a third metal layer 74, and a passivation layer 76 are formed sequentially over the substrate. The transparent conductive layer 72 can be made of indium tin oxide or indium zinc oxide. As the metal layers 32, 40, the third metal layer 74 can be made of aluminum, tungsten, chromium, copper, titanium, titanium nitride, aluminum alloy, chromium alloy, or molybdenum. Also, the structure of the third metal layer 74 can be a single-layered or a multiple-layered structure. Besides, the material of the passivation layer 76 can be the same as that of the interlayer insulating layer 60 and that of the gate insulating layer 34. Therefore, the electrical contact among the source/drain contact hole, the scan line contact hole and the terminal contact hole are completed, and the metal layers are well protected.

Afterward, the third patterning process is implemented. As shown in FIGS. 9 and 10A, a third photoresist layer 83 is formed on part of the passivation layer 76. The third photoresist layer 83 has a fifth area 82 and a sixth area 84, of which the thickness is thinner than that of the fifth area 82.

Figure 10B:
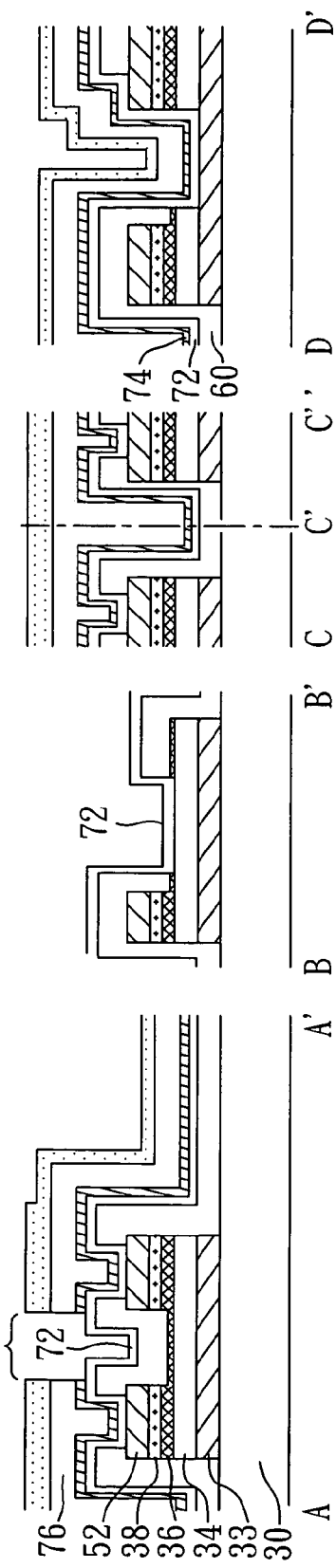

Next, the exposed passivation layer 76 and the third metal layer 74 thereunder are removed sequentially by etching to expose the transparent conductive layer 72 and thereby to define a predetermined source/drain disconnection area 85, as shown in FIG. 10B.

Figure 10C:
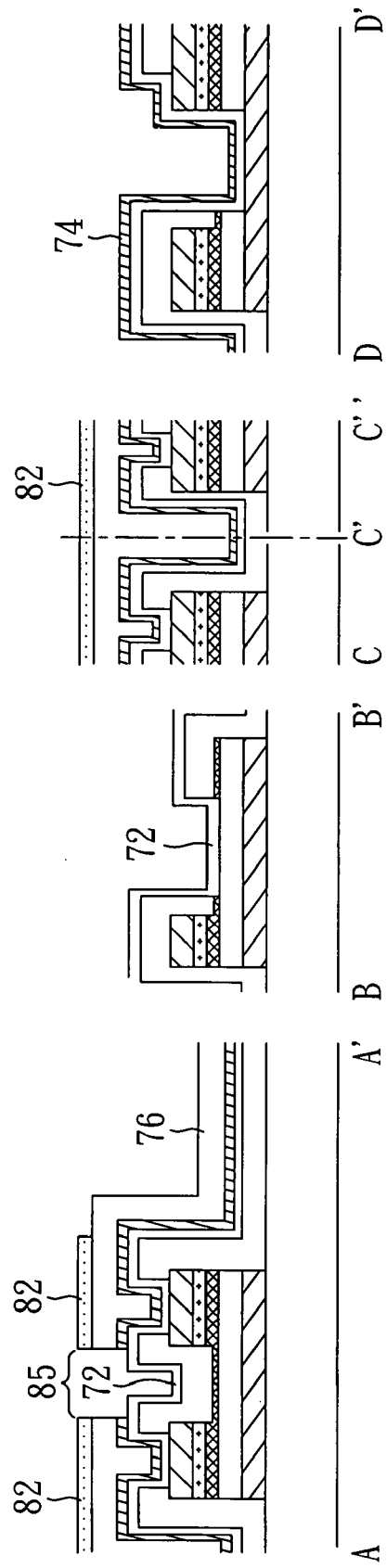
Figure 10D:
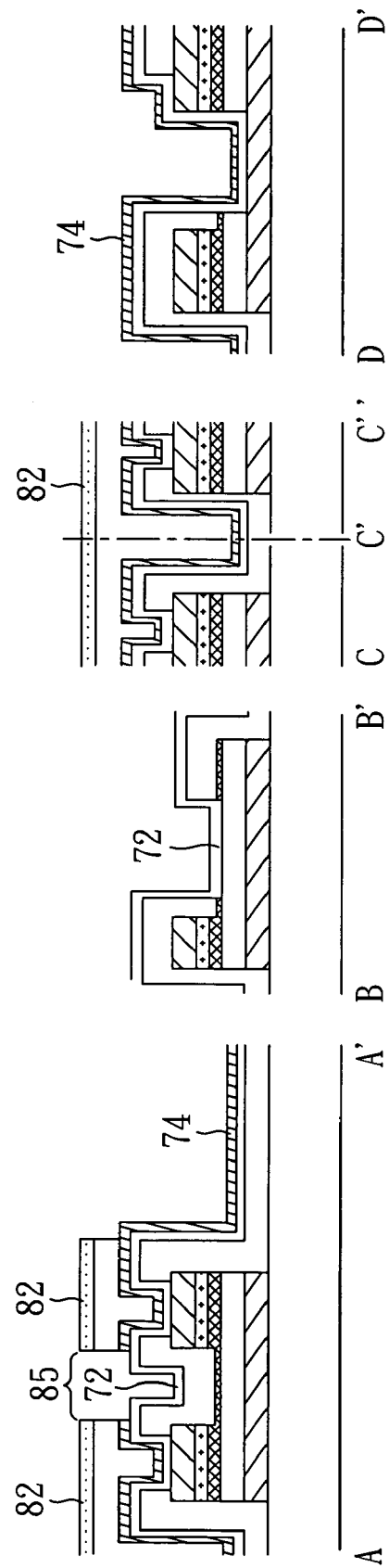
Figure 10E:
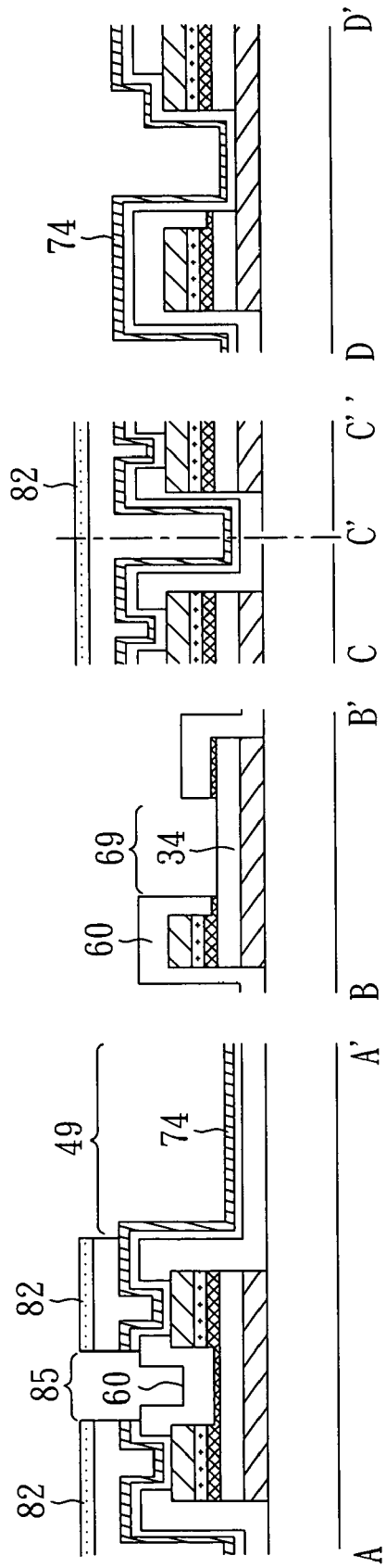

Thereafter, the sixth area 84 of the third photoresist layer 83 is removed by ashing to expose the passivation layer 76, as shown in FIG. 10C. Then, the exposed passivation layer 76 is etched to expose the third metal layer 74 thereunder, as shown in FIG. 10D.

Afterward, a high metal-transparent conductive material selectivity etchant is used to remove the exposed transparent conductive layer 72 at the predetermined source/drain disconnection area 85 with non-destruction of the metal layer. As a result, the electrical connection between the source electrode and the drain electrode is terminated. Also, the electrical connection at the predetermined disconnection area 69 is obviated to avoid the electrical conduction between the scan line and the channel 37 of the TFT.

Figure 10F:
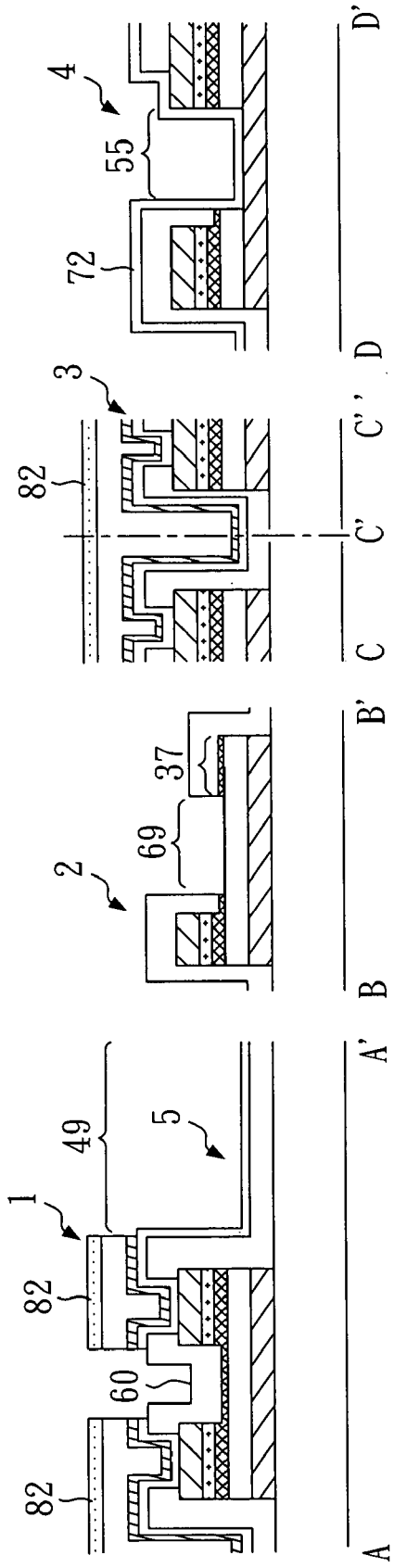

Next, the exposed third metal layer 74 is removed by etching to expose the transparent conductive layer 72 at both the terminal contact area 55 and the pixel area 49. Finally, the fifth area 82 of the third photoresist layer is removed to form the TFT1, the scan line 2, the data line 3, the terminal contact 4, and the pixel electrode 5, as shown in FIG. 10F.

Figure 10G:
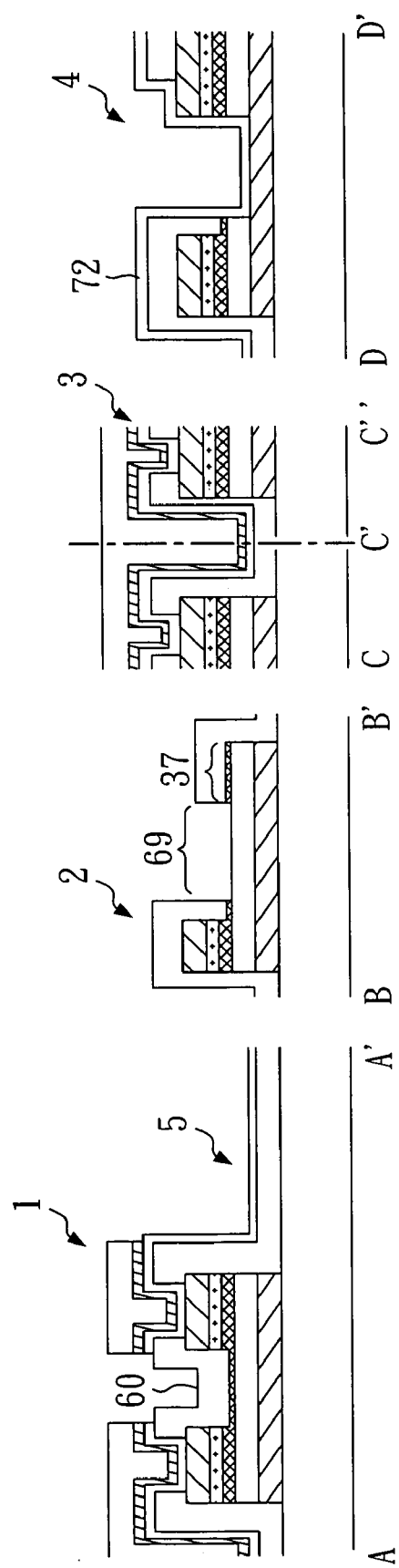

Otherwise, the TFT1, the scan line 2, the data line 3, the terminal contact 4, and the pixel electrode 5 can be formed by removing the fifth area 82 of the third photoresist layer before the exposed third metal layer 74, as shown in FIG. 10G.

So far, the third patterning process has been completed, and the TFT array substrate is also finished.

The TFT array substrate manufactured in Embodiment 1 is useful and can be applied to the liquid crystal display device, especially to the transmissive liquid crystal display device. In addition, if the scopes or the ratio of the fifth area 82 and the sixth area 84 covered by the drain electrode area 53 and the pixel area 49 can be well adjusted in the third patterning process, then the pixel electrode 5 will have a reflective surface that is partially covered by the third metal layer 74 and a transmissive electrode that has a partially exposed transparent conductive layer 72. Consequently, the TFT array substrate can be used in the semi-transmissive liquid crystal display deice. The third metal layer of such a TFT array can also have a single layer or a multi-layered structure, but its top layer must be made of metal with good reflectivity, such as aluminum, chromium, aluminum alloy, chromium alloy, or silver.

Embodiment 2

Furthermore, the pixel electrode can be made of metal materials when the TFT array is used for a reflective type liquid crystal display device. The manufacturing method for the above-mentioned TFT array is generally the same as Embodiment 1 except that the third patterning process is slightly different and described as the following. Reference is made again to the same drawings, and the related symbols are used again.

With reference to FIGS. 9 and 11A to 11D, there are schematic views showing the process flow of the third patterning process of the present embodiment. FIG. 9 shows the top view of the layout on the substrate when the third patterning process is carried out, and FIGS. 11A to 11D show the sectional views thereof.

With reference to FIG. 11A, a third metal layer 74 and a passivation layer 76 are sequentially deposited over the substrate. The third metal layer 74 can be made of aluminum, tungsten, chromium, copper, titanium, titanium nitride, molybdenum, aluminum alloy, chromium alloy, or silver, and the structure thereof can be a single-layered or a multiple-layered structure, which has the proviso that the top layer must be made of metal with good reflectivity, such as aluminum, chromium, aluminum alloy, chromium alloy, or silver. As for the passivation layer 76, its material can be the same as the materials of the interlayer insulating layer 60 or the gate insulating layer 34. Consequently, the electrical connections among all the contact holes are achieved, and the metal lines serving as circuits are well protected. In the present embodiment, for the subsequent multi-etching, the thickness of the passivation layer 76 must be less than a specific thickness T, which is the thinner between half the thickness of the interlayer insulating layer 60 and half the thickness of the gate insulating layer 34. Why the thickness of the passivation layer 76 must be less than half the thickness of the interlayer insulating layer 60 and half the thickness of the gate insulating layer will be explained later.

Next, a third patterning process is carried out. As shown in FIGS. 9 and 11A, a third photoresist layer 83 is formed on part of the passivation layer 76, and is composed of a fifth area 82 and a sixth area 84, of which the thickness is thinner than that of the fifth area 82.

Afterward, the passivation layer 76 that is not covered by the third photoresist layer 83 and the third metal layer 74 are sequentially etched to expose the interlayer insulating layer 60 and thereby to terminate the electrical connection between the source electrode and the drain electrode as well as the electrical connection at the area 69, as shown in FIG. 11B. Therefore, the electric conduction between the scan line and the channel 37 of the TFT is avoided.

Thereafter, the sixth area 84 of the third photoresist layer 83 is removed by ashing to expose part of the passivation layer 76, as shown in FIG. 11C. Then, the exposed passivation layer 76 is etched to expose the third metal layer 74 at both the terminal contact area 55 and the pixel area 49, as shown in FIG. 5. Certainly, part of the uncovered interlayer insulating layer 60 at the scan line area 45 and part of the uncovered gate insulating layer 34 at the predetermined disconnection area 69 are etched simultaneously. However, the remaining insulating layers are thicker than half their original thickness and are still protective for the thin film transistors and the scan lines.

Finally, the fifth area 82 of the third photoresist layer 83 is removed to form the TFT1, the scan line 2, the data line 3, the terminal contact 4, and the reflective type pixel electrode 6 having the third metal layer 74 that is reflective.

Embodiment 3

Most of the present embodiment is the same as Embodiment 1, except that the pattern of the masks used in the patterning processes are slightly changed as the following. Similarly, reference is made again to the same drawings, and the symbols are used again.

Figure 12:
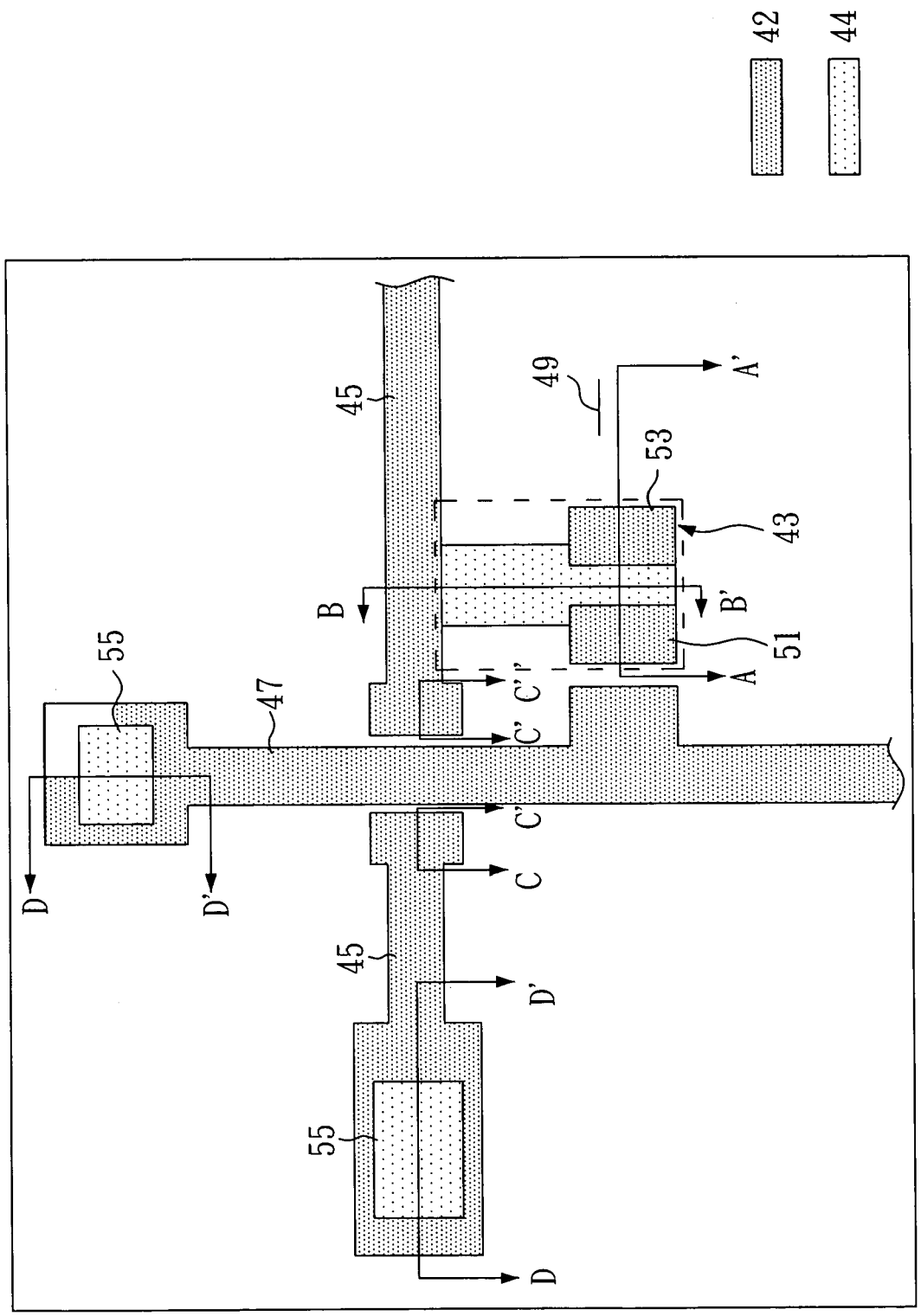
FIG. 12 is a top view showing the layout on the substrate of the first patterning process in the third embodiment of the present invention.

FIG. 12 is the top view showing the layout on the substrate when the first patterning process is carried out in the present embodiment. The scan line area 45 is predetermined to form the scan line of the TFT array. The scan line area 45 is terminated when it comes across the data line area 47, which is different from Embodiment 1 and will affect the mask patterns used in the second and third patterning processes. After the first patterning process, the source/drain electrode area, the scan line area, the data line area, the terminal contact area, and the pixel area are defined.

Next, the interlayer insulating layer is formed over the substrate. By the second patterning process, the source/drain contact holes, the scan line contact hole, and the terminal contact hole are formed.

Finally, a transparent conductive layer is optionally formed over the substrate depending on the type of the LCD device, and then a third metal layer and a passivation layer are sequentially formed. As a result, the electrical connections among those contact holes are achieved, and those contact holes are well protected. Afterward, the TFT, the scan line, the data line, the terminal contact, and the pixel electrode are formed by the third patterning process.

So far, another TFT array is completed.

From the above-mentioned embodiments, the present invention provides a progressive method for manufacturing the TFT array substrate by using three photolithography processes only. In addition, the yield of the TFT array substrate is increased, and thereby the displaying quality is effectively guaranteed.

Although the present invention has been explained in relation to the above-mentioned preferred embodiment, it is to be understood that those embodiments are illustrative only, and various changes in form and details can be made without departing from the spirit and scope of the invention as defined by the appended claims.

What is claimed is:

1. A method for manufacturing a thin film transistor array substrate, comprising the steps of:
   providing a substrate;
   forming a first metal layer, a gate insulating layer, a semiconductor layer, an ohmic contact layer and a second metal layer over the substrate, and then carrying out a first patterning process to define a source/drain electrodes area, a scan line area, a data line area, a terminal contact area and a pixel area;
   forming an interlayer insulating layer over the substrate, and carrying out a second patterning process to define a source/drain contact hole, a data line contact hole and a terminal contact hole; and
   forming a transparent conductive layer, a third metal layer and a passivation layer to protect over the substrate and achieve electrical connections among the source/drain contact hole, the data line contact hole and the terminal contact hole, and then carrying out a third patterning process to form a thin film transistor, a scan line, a data line, a terminal contact and a pixel electrode.

2. The method as claimed in claim 1, wherein the first patterning process including:
  forming on part of the second metal layer a first photoresist layer having a first area and a second area, of which the thickness is thinner than the thickness of the first area;
  etching the second metal layer, the ohmic contact layer, the semiconductor layer, the gate insulating layer and the first metal layer which are not covered by the first photoresist layer to define a predetermined TFT area, the scan line area, the data line area and the pixel area; and
  removing the second area of the first photoresist layer to expose the second metal layer, and then etching the exposed second metal layer and the ohmic contact layer thereunder to define the source/drain electrodes area and the terminal contact area.

3. The method as claimed in claim 2, wherein the second area of the first photoresist layer is removed by ashing.

4. The method as claimed in claim 2, wherein the first photoresist layer is formed by using a mask having a substantially transparent area, a partially transparent area and a substantially opaque area, the substantially opaque area is corresponding to the first area, and the partially transparent area is corresponding to the second area.

5. The method as claimed in claim 1, wherein the second patterning process including:
  forming on part of the interlayer insulating layer a second photoresist layer having a third area and a fourth area, of which the thickness is thinner than the thickness of the third area;
  etching the interlayer insulating layer and the semiconductor layer which are not covered by the second photoresist layer to define a predetermined terminal contact hole area; and
  removing the fourth area of the second photoresist layer to expose the interlayer insulating layer, and then etching the exposed interlayer insulating layer, the semiconductor layer thereunder and the gate insulating layer in the predetermined terminal contact hole area to form the source/drain contact hole, the data line contact hole and the terminal contact hole.

6. The method as claimed in claim 1, wherein the second patterning process including:
  forming on part of the interlayer insulating layer a second photoresist layer having a third area and a fourth area, of which the thickness is thinner than the thickness of the third area;
  etching the interlayer insulating layer that is not covered by the second photoresist layer to define a predetermined terminal contact hole area; and
  removing the fourth area of the second photoresist layer to expose the interlayer insulating layer, and then etching the exposed interlayer insulating layer, and the gate insulating layer and the semiconductor layer in the predetermined terminal contact hole area to form the source/drain contact hole, the data line contact hole and the terminal contact hole.

7. The method as claimed in claim 1, wherein the third patterning process including:
  forming on part of the passivation layer a third photoresist layer having a fifth area and a sixth area, of which the thickness is thinner than the thickness that of the fifth area;
  etching the passivation layer and the third metal layer which are not covered by the third photoresist layer to expose the transparent conductive layer and thereby to define a predetermined source/drain disconnection area;
  removing the sixth area of the third photoresist layer to expose the passivation layer, and then etching the exposed passivation layer;
  etching the transparent conductive layer that is exposed, in particular the transparent conductive layer in the predetermined source/drain disconnection area, to terminate the electrical connection between the source electrode and the drain electrode as well as the electrical connection between the TFT area and the scan line area; and
  etching the third metal layer that is exposed to expose the transparent conductive layer in the terminal contact area and in the pixel area, and thereby to form the thin film transistor, the scan line, the data line, the terminal contact and the pixel electrode.

8. A method for manufacturing a thin film transistor array substrate, comprising the steps of:
  providing a substrate;
  forming a first metal layer, a gate insulating layer, a semiconductor layer, an ohmic contact layer and a second metal layer over the substrate, and then carrying out a first patterning process to define a source/drain electrodes area, a scan line area, a data line area, a terminal contact area and a pixel area;
  forming an interlayer insulating layer over the substrate, and carrying out a second patterning process to form a source/drain contact hole, a scan line contact hole and a terminal contact hole; and
  forming a transparent conductive layer, a third metal layer and a passivation layer to protect over the substrate and achieve electrical connections among the source/drain contact hole, the scan line contact hole and the terminal contact hole, and then carrying out a third patterning process to form a thin film transistor, a scan line, a data line, a terminal contact and a pixel electrode.

9. The method as claimed in claim 8, wherein the first patterning process including:
  forming on part of the second metal layer a first photoresist layer having a first area and a second area, of which the thickness is thinner than the thickness of the first area;
  etching the second metal layer, the ohmic contact layer, the semiconductor layer, the gate insulating layer and the first metal layer which are not covered by the first photoresist layer to define a predetermined TFT area, the scan line area, the data line area and the pixel area; and
  removing the second area of the first photoresist layer to expose the second metal layer, and then etching the exposed second metal layer and the ohmic contact layer thereunder to define the source/drain electrodes area and the terminal contact area.

10. The method as claimed in claim 9, wherein the second area of the first photoresist layer is removed by ashing.

11. The method as claimed in claim 9, wherein the first photoresist layer is formed by using a mask having a substantially transparent area, a partially transparent area and a substantially opaque area, the substantially opaque area is corresponding to the first area, and the partially transparent area is corresponding to the second area.

12. The method as claimed in claim 8, wherein the second patterning process including:
forming on part of the interlayer insulating layer a second photoresist layer having a third area and a fourth area, of which the thickness is thinner than the thickness of the third area;
etching the interlayer insulating layer and the semiconductor layer which are not covered by the second photoresist layer to define a predetermined terminal contact hole area; and
removing the fourth area of the second photoresist layer to expose the interlayer insulating layer, and then etching the exposed interlayer insulating layer, the semiconductor layer thereunder and the gate insulating layer in the predetermined terminal contact hole area to form the source/drain contact hole, the scan line contact hole and the terminal contact hole.

13. The method as claimed in claim 8, wherein the second patterning process including:
forming on part of the interlayer insulating layer a second photoresist layer having a third area and a fourth area, of which the thickness is thinner than the thickness of the third area;
etching the interlayer insulating layer that is not covered by the second photoresist layer to define a predetermined terminal contact hole area; and
removing the fourth area of the second photoresist layer to expose the interlayer insulating layer, and then etching the exposed interlayer insulating layer, the semiconductor layer thereunder and the semiconductor layer and the gate insulating layer in the predetermined terminal contact hole area to form the source/drain contact hole, the scan line contact hole and the terminal contact hole.

14. The method as claimed in claim 8, wherein the third patterning process including:
forming on part of the passivation layer a third photoresist layer having a fifth area and a sixth area, of which the thickness is thinner than that of the fifth area;
etching the passivation layer and the third metal layer which are not covered by the third photoresist layer to expose the transparent conductive layer and thereby to define a predetermined source/drain disconnection area;
removing the sixth area of the third photoresist layer to expose the passivation layer, and then etching the exposed passivation layer;
etching the transparent conductive layer that is exposed, in particular the transparent conductive layer in the predetermined source/drain disconnection area, to terminate the electrical connection between the source electrode and the drain electrode as well as the electrical connection between the TFT area and the scan line area; and
etching the third metal layer that is exposed to expose the transparent conductive layer in the terminal contact area and in the pixel area, and thereby to form the thin film transistor, the scan line, the data line, the terminal contact and the pixel electrode.

15. A method for manufacturing a thin film transistor array substrate, comprising the steps of:
providing a substrate;
forming a first metal layer, a gate insulating layer, a semiconductor layer, an ohmic contact layer and a second metal layer over the substrate, and then carrying out a first patterning process to define a source/drain electrodes area, a scan line area, a data line area, a terminal contact area and a pixel area;
forming an interlayer insulating layer over the substrate, and carrying out a second patterning process to form a source/drain contact hole, a data line contact hole and a terminal contact hole; and
forming a third metal layer and a passivation layer to protect over the substrate and achieve electrical connections among the source/drain contact hole, the data line contact hole and the terminal contact hole, and then carrying out a third patterning process to form a thin film transistor, a scan line, a data line, a terminal contact and a reflective pixel electrode.

16. The method as claimed in claims 15, wherein the third patterning process including:
forming on part of the passivation layer a third photoresist layer having a fifth area and a sixth area, of which the thickness is thinner than the thickness of the fifth area;
etching the passivation layer and the third metal layer which are not covered by the third photoresist layer to terminate the electrical connection between the source electrode and the drain electrode as well as the electrical connection between the TFT area and the scan line area; and
removing the sixth area of the third photoresist layer to expose the passivation layer, then etching the exposed passivation layer to expose the third metal layer in the pixel area, and thereby forming the thin film transistor, the scan line, the data line, the terminal contact and the reflective pixel electrode.

17. The method as claimed in claim 16, wherein the sixth area of the third photoresist layer is removed by ashing.

18. The methods as claimed in claim 16, wherein the third photoresist layer is formed by using a mask having a substantially transparent area, a partially transparent area and a substantially opaque area, the substantially opaque area is corresponding to the fifth area, and the partially transparent area is corresponding to the sixth area.

19. A method for manufacturing a TFT array substrate, comprising the steps of:
providing a substrate;
forming a first metal layer, a gate insulating layer, a semiconductor layer, an ohmic contact layer and a second metal layer over the substrate, and then carrying out a first patterning process to define a source/drain electrodes area, a scan line area, a data line area, a terminal contact area and a pixel area;
forming an interlayer insulating layer over the substrate, and carrying out a second patterning process to form a source/drain contact hole, a scan line contact hole and a terminal contact hole; and
forming at third metal layer and a passivation layer to protect over the substrate and achieve electrical connections among the source/drain contact hole, the scan line contact hole and the terminal contact hole, and then carrying out a third patterning process to form a thin film transistor, a scan line, a data line, a terminal contact and a reflective pixel electrode.

20. The method as claimed in claims 19, wherein the third patterning process including:
forming on part of the passivation layer a third photoresist layer having a fifth area and a sixth area, of which the thickness is thinner than the thickness of the fifth area;
etching the passivation layer and the third metal layer which are not covered by the third photoresist layer to terminate the electrical connection between the source electrode and the drain electrode as well as the electrical connection between the TFT area and the scan line area; and removing the sixth area of the third photoresist layer to expose the passivation layer, then etching the exposed passivation layer to expose the third metal layer in the pixel area, and thereby forming the thin film transistor, the scan line, the data line, the terminal contact and the reflective pixel electrode.

* * * * *